United States Patent
Kurokawa et al.

(10) Patent No.: US 11,380,601 B2
(45) Date of Patent: Jul. 5, 2022

(54) SEMICONDUCTOR DEVICE AND METHOD FOR MANUFACTURING SEMICONDUCTOR DEVICE

(71) Applicant: Murata Manufacturing Co., Ltd., Kyoto-fu (JP)

(72) Inventors: Atsushi Kurokawa, Nagaokakyo (JP); Yuichi Sano, Nagaokakyo (JP); Toshihiro Tada, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/744,525

(22) Filed: Jan. 16, 2020

(65) Prior Publication Data

US 2020/0152545 A1  May 14, 2020

Related U.S. Application Data

(63) Continuation of application No. PCT/JP2018/024215, filed on Jun. 26, 2018.

(30) Foreign Application Priority Data

Jul. 24, 2017  (JP) .............................. JP2017-142592

(51) Int. Cl.
 *H01L 21/56* (2006.01)
 *H01L 21/3205* (2006.01)
 (Continued)

(52) U.S. Cl.
 CPC .... *H01L 23/3675* (2013.01); *H01L 21/32051* (2013.01); *H01L 21/565* (2013.01);
 (Continued)

(58) Field of Classification Search
 CPC ............. H01L 23/3675; H01L 23/3121; H01L 21/32051; H01L 21/565; H01L 21/78;
 (Continued)

(56) References Cited

U.S. PATENT DOCUMENTS

10,115,651 B2 * 10/2018 Nishimura .............. H01L 24/82
2007/0187839 A1 * 8/2007 Shim .................. H01L 23/49568
257/784

(Continued)

FOREIGN PATENT DOCUMENTS

CN   104681512 A   6/2015
JP   H04-72652 A   3/1992
(Continued)

OTHER PUBLICATIONS

International Search Report issued in PCT/JP2018/024215; dated Aug. 21, 2018.
(Continued)

*Primary Examiner* — Timor Karimy
(74) *Attorney, Agent, or Firm* — Studebaker & Brackett PC

(57) ABSTRACT

A semiconductor chip is mounted on a substrate in a face-down manner. A metal film is arranged on a back surface of the semiconductor chip facing an opposite side from the substrate away from an edge of the back surface. A sealing resin layer seals the semiconductor chip with a part of the metal film being exposed from the sealing resin layer.

17 Claims, 5 Drawing Sheets

(51) Int. Cl.
*H01L 23/367* (2006.01)
*H01L 21/78* (2006.01)
*H01L 23/31* (2006.01)
*H01L 23/00* (2006.01)

(52) U.S. Cl.
CPC .......... *H01L 21/78* (2013.01); *H01L 23/3121* (2013.01); *H01L 24/16* (2013.01); *H01L 24/81* (2013.01); *H01L 2224/16225* (2013.01)

(58) Field of Classification Search
CPC .................... H01L 24/16; H01L 24/81; H01L 2224/16225
See application file for complete search history.

(56) References Cited

U.S. PATENT DOCUMENTS

2012/0171814 A1* 7/2012 Choi .................. H01L 23/3128
438/107
2013/0241044 A1* 9/2013 Kim ................. H01L 23/49816
257/698

FOREIGN PATENT DOCUMENTS

| | | |
|---|---|---|
| JP | H07-183425 A | 7/1995 |
| JP | H08-203914 A | 8/1996 |
| JP | H11-233681 A | 8/1999 |
| JP | 2003-31744 * | 7/2001 |
| JP | 2003-31744 A | 1/2003 |
| JP | 2004-134480 A | 4/2004 |
| JP | 2004-172542 A | 6/2004 |
| JP | 2004-327556 A | 11/2004 |
| JP | 2004-327558 A | 11/2004 |
| JP | 2010-114256 A | 5/2010 |
| JP | 2011-61116 A | 3/2011 |
| JP | 2012-142572 A | 7/2012 |
| JP | 2012-523695 A | 10/2012 |
| WO | 2014/020783 A1 | 2/2014 |

OTHER PUBLICATIONS

International Preliminary Report on Patentability and Written Opinion issued in PCT/JP2018/024215; dated Jan. 28, 2020.

* cited by examiner

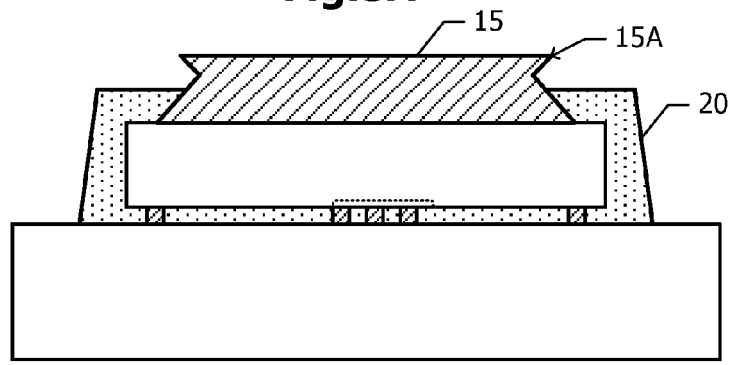
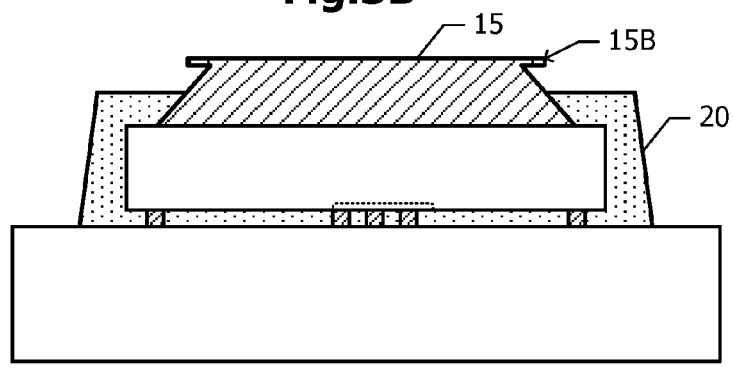
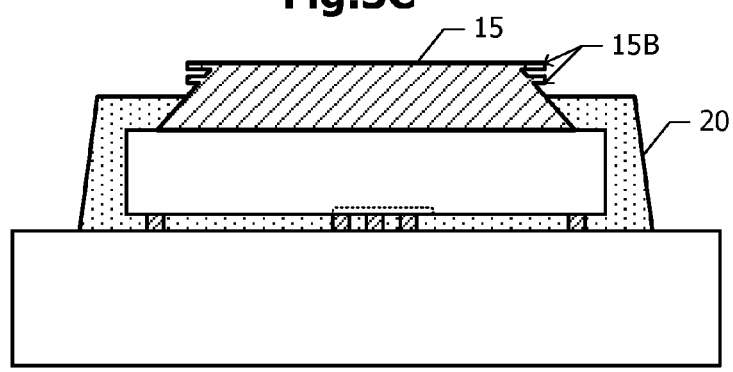

SEMICONDUCTOR DEVICE AND METHOD FOR MANUFACTURING SEMICONDUCTOR DEVICE

CROSS-REFERENCE TO RELATED APPLICATIONS

This application claims benefit of priority to International Patent Application No. PCT/JP2018/024215, filed Jun. 26, 2018, and to Japanese Patent Application No. 2017-142592, filed Jul. 24, 2017, the entire contents of each are incorporated herein by reference.

BACKGROUND

Technical Field

The present disclosure relates to a semiconductor device and a method for manufacturing a semiconductor device.

Background Art

A semiconductor device having an excellent heat dissipation property is disclosed in Japanese Unexamined Patent Application Publication No. 2004-327558, Japanese Unexamined Patent Application Publication No. 2004-327556 and Japanese Unexamined Patent Application Publication No. 4-72652 described below. The semiconductor device disclosed in Japanese Unexamined Patent Application Publication No. 2004-327558 and Japanese Unexamined Patent Application Publication No. 2004-327556 includes an interposer, a semiconductor chip mounted on the interposer in a face-down manner, a metal plate bonded to the semiconductor chip, and a sealing resin. The metal plate is bonded to a surface on an opposite side of the semiconductor chip from a flip-chip bonding portion, and has an area larger than that of this surface. For bonding the metal plate, an adhesive such as silicone grease, silver paste, solder paste, or the like is used.

In the semiconductor device disclosed in Japanese Unexamined Patent Application Publication No. 2004-327558, the sealing resin covers a gap of the flip-chip bonding portion, a surface of the semiconductor chip other than the bonding surface to the metal plate, and the entire surface of the metal plate other than the bonding surface to the semiconductor chip. Heat generated in the semiconductor chip is transferred to the metal plate, and is dissipated through the sealing resin from the metal plate having a large surface area. In the semiconductor device disclosed in Japanese Unexamined Patent Application Publication No. 2004-327556, a part of a surface of the metal plate is exposed on a surface of the sealing resin. The heat generated in the semiconductor chip can be dissipated through the sealing resin from the metal plate and can be dissipated from the exposed surface of the metal plate.

In the semiconductor device disclosed in Japanese Unexamined Patent Application Publication No. 4-72652, a heat radiator is fixed to an upper surface of a semiconductor chip which is surface-mounted on a substrate with an adhesive interposed therebetween. The heat radiator includes a shaft-type boss and a plate-shaped fin formed vertically around the shaft-type boss as the center. The heat generated in the semiconductor chip is transmitted to the heat radiator, and is emitted to the outside from the fin.

SUMMARY

In the existing semiconductor device, after dividing into a semiconductor chip and before sealing with the sealing resin, it is necessary to bond the metal plate or the heat radiator to the semiconductor chip. Thus, the present disclosure provides a semiconductor device which is excellent in a heat radiation property without performing a step of bonding a metal plate or the like after dividing into a semiconductor chip.

According to an aspect of the present disclosure, a semiconductor device is provided. The semiconductor device includes a substrate; a semiconductor chip mounted on the substrate in a face-down manner; a metal film arranged on a back surface of the semiconductor chip facing an opposite side from the substrate away from an edge of the back surface; and a sealing resin layer configured to seal the semiconductor chip and cause a part of the metal film to be exposed.

According to another aspect of the present disclosure, a method for manufacturing a semiconductor device is provided. The method includes forming a metal film on a plurality of circuit formation regions partitioned by dicing streets on a back surface of a semiconductor wafer; dividing, after forming the metal film, the semiconductor wafer into a plurality of semiconductor chips by cutting with a dicing machine along the dicing streets; mounting the semiconductor chip on a substrate in a face-down manner; and sealing the semiconductor chip with a sealing resin layer.

Heat generated in a semiconductor chip is transmitted to a metal film, and is emitted from an exposed surface of the metal film. Since the metal film is arranged away from an edge of a back surface of the semiconductor chip, before dividing from a semiconductor wafer to the semiconductor chips (before cutting with a dicing machine), it is possible to form the metal film in a state of the semiconductor wafer. In a case that the metal film is formed in the state of the semiconductor wafer, it is not necessary to bond the metal film to each of the semiconductor chips after dividing into the semiconductor chips. By making the metal film be formed in a circuit formation region and not be formed on the dicing street, it is possible to suppress chipping caused by the metal film at the time of cutting with a dicing machine from occurring.

BRIEF DESCRIPTION OF THE DRAWINGS

FIG. 3A, FIG. 3B, and FIG. 3C are cross-sectional views of semiconductor devices according to a second embodiment, a first modification of the second embodiment, and a second modification of the second embodiment, respectively;

DETAILED DESCRIPTION

First Embodiment

A semiconductor device according to a first embodiment of the present disclosure will be described with reference to the drawings from FIG. 1A to FIG. 2F.

Figure 1A:
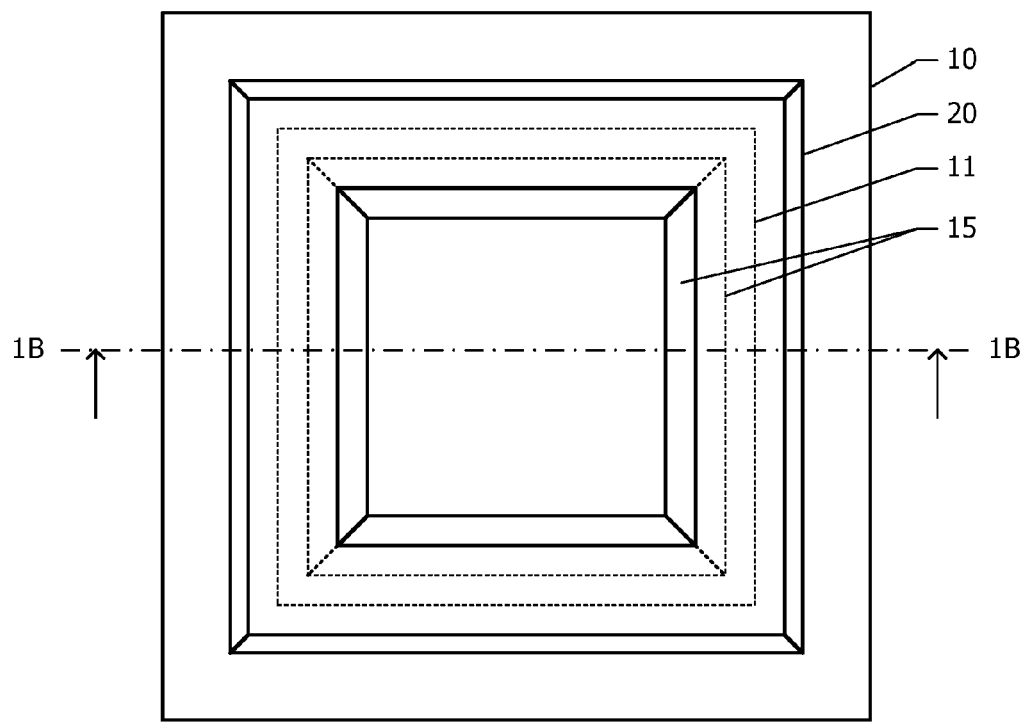
FIG. 1A is a plan view of a semiconductor device according to a first embodiment.
Figure 1B:
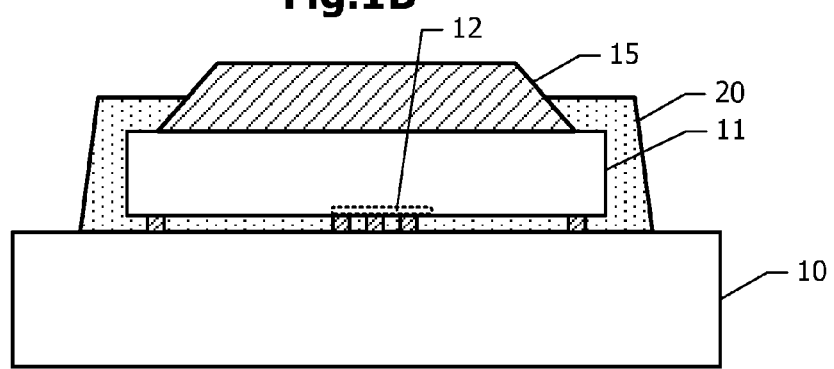
FIG. 1B is a cross-sectional view taken along a dot-dash line 1B-1B in FIG. 1A.

FIG. 1A is a plan view of a semiconductor device according to the first embodiment, and FIG. 1B is a cross-sectional view taken along a dot-dash line 1B-1B in FIG. 1A. A semiconductor chip 11 is mounted on a substrate 10 in a face-down manner. The substrate 10 is, for example, an interposer (package substrate). The semiconductor chip 11 is, for example, subjected to flip-chip bonding to the substrate 10. The semiconductor chip 11 is configured such that, for example, a power amplifier circuit including a heterobipolar transistor (HBT) 12 and the like is formed on a surface of a GaAs substrate. The HBT 12 and the like become a heat source.

A metal film 15 is arranged on a back surface of the semiconductor chip 11 facing the opposite side from the substrate 10 away from an edge of the back surface. The semiconductor chip 11 is sealed with a sealing resin layer 20. The sealing resin layer 20 covers a space between the substrate 10 and the semiconductor chip 11, a side surface of the semiconductor chip 11, a region where the metal film 15 is not arranged of an upper surface of the semiconductor chip 11, and a part on a lower side of a side surface of the metal film 15. A part of the surface of the metal film 15 is exposed, and protrudes upward from an upper surface of the sealing resin layer 20.

Copper (Cu), for example, can be used for the metal film 15. For the sealing resin layer 20, for example, a filler-containing resin in which a filler is dispersed in a binder resin such as an epoxy resin can be used.

Next, a method for manufacturing the semiconductor device according to the first embodiment will be described with reference to the drawings from FIG. 2A to FIG. 2F.

Figure 2A:
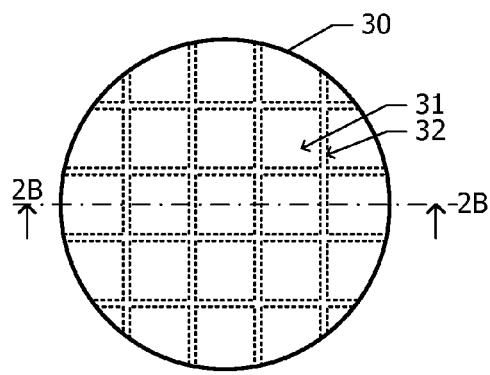
FIG. 2A is a plan view of a semiconductor wafer in which a semiconductor integrated circuit is formed on an element formation surface.
Figure 2B:
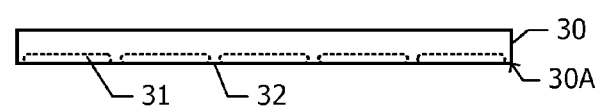
FIG. 2B is a cross-sectional view taken along a dot-dash line 2B-2B in FIG. 2A.

FIG. 2A is a plan view of a semiconductor wafer 30 in which a semiconductor integrated circuit is formed on an element formation surface, and FIG. 2B is a cross-sectional view taken along a dot-dash line 2B-2B in FIG. 2A. A circuit formation region 31 partitioned by a dicing street 32 is defined in the semiconductor wafer 30. A semiconductor integrated circuit constituted of a power amplifier circuit and the like including the HBT 12 (FIG. 1B) is formed in the circuit formation region 31 of an element formation surface 30A of the semiconductor wafer 30. The semiconductor integrated circuit can be formed using a typical semiconductor process.

Figure 2C:
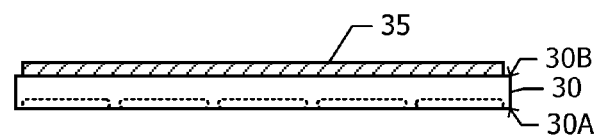
FIG. 2C is a cross-sectional view illustrating a state in which a metal film is formed on a back surface (a surface on an opposite side from the element formation surface) of the semiconductor wafer.

As illustrated in FIG. 2C, a metal film 35 is formed on a back surface 30B (a surface on an opposite side from the element formation surface 30A) of the semiconductor wafer 30. The metal film 35 is formed by using a film formation method such as vapor deposition, sputtering, or the like. Using a resist pattern as an etching mask, the metal film 35 is etched along the dicing street 32 (FIG. 2A and FIG. 2B). A typical wet etching method can be used for etching of the metal film 35.

Figure 2D:
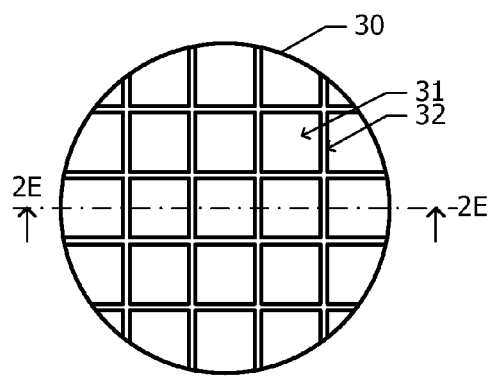
FIG. 2D is a plan view of the semiconductor wafer after etching the metal film.
Figure 2E:
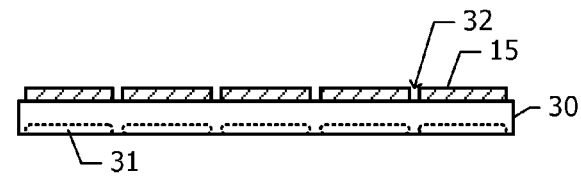
FIG. 2E is a cross-sectional view taken along a dot-dash line 2E-2E in FIG. 2D.

FIG. 2D is a plan view of the semiconductor wafer 30 after etching the metal film 35, and FIG. 2E is a cross-sectional view taken along a dot-dash line 2E-2E of FIG. 2D. By etching the metal film 35 (FIG. 2C) along the dicing street 32, the patterned metal film 15 remains at a position corresponding to the circuit formation region 31 (FIG. 2A and FIG. 2B). When a typical wet etching is used, the side surface of the formed metal film 15 (FIG. 1B) is slanted, and a trapezoidal cross-sectional shape is obtained.

Figure 2F:
FIG. 2F is a cross-sectional view of semiconductor chips after dividing the semiconductor wafer into a plurality of semiconductor chips by cutting the semiconductor wafer with a dicing machine along dicing streets.

As illustrated in FIG. 2F, the semiconductor wafer 30 is cut with a dicing machine along the dicing streets 32 (FIG. 2D and FIG. 2E). With this, a plurality of the semiconductor chips 11 each having the metal film 15 formed on the back surface 30B is obtained. Since an actual cutting width is narrower than a width of the dicing street 32, the metal film 15 is arranged slightly away from the edge of the semiconductor chip 11.

After dividing into the plurality of semiconductor chips 11, flip-chip bonding to the substrate 10 (FIG. 1B) is performed in a face-down manner. Thereafter, the sealing resin layer 20 (FIG. 1B) is formed by using a metal mold for resin molding. At this time, by using the metal mold matching a shape of the protruding portion of the metal film 15, the upper surface of the sealing resin layer 20 can be made to be lower than an upper surface of the metal film 15. In other words, the metal film 15 can be made to protrude from the upper surface of the sealing resin layer 20.

Next, excellent effects of the semiconductor device according to the first embodiment will be described.

The heat generated in the HBT 12 (FIG. 1B) and the like of the semiconductor chip 11 is transmitted to the metal film 15 through the semiconductor chip 11, and is radiated outside from the exposed surface of the metal film 15. Since the metal film 15 is in direct contact with the back surface of the semiconductor chip 11 without interposing an adhesive or the like, and a foreign substance such as an adhesive is not present in a heat transfer path, deterioration in heat transfer characteristics due to the foreign substance can be prevented. In addition, in a case that an adhesive is interposed between the semiconductor chip 11 and the metal film 15, when a stress is generated due to a difference in thermal expansion coefficients among these materials, the metal film 15 is likely to be peeled off from the semiconductor chip 11. In the first embodiment, since the metal film 15 is in direct contact with the semiconductor chip 11, the metal film 15 is less likely to be peeled off from the semiconductor chip 11.

In the first embodiment, since a part of the metal film 15 is exposed, a heat radiation property can be enhanced compared to a configuration in which the metal film 15 is embedded in the sealing resin layer 20. Furthermore, by causing the metal film 15 to protrude upward from the upper surface of the sealing resin layer 20, an area of the surface where the metal film 15 is exposed increases. Therefore, the heat radiation property can be further enhanced. Since a temperature rise in the semiconductor chip 11 is suppressed by securing the high heat radiation property, deterioration in characteristics due to the temperature rise can be prevented and the lifespan of the semiconductor device can be extended.

Furthermore, in the first embodiment, the metal film 35 is formed in the state of the semiconductor wafer 30 (FIG. 2D and FIG. 2E) before cutting with the dicing machine. Therefore, manufacturing man-hours can be reduced compared to a case that a metal plate is bonded to each of the semiconductor chips 11 after being divided into the individual semiconductor chips 11.

In a case that cutting with the dicing machine is performed in a state in which the metal film 35 is formed on the entire surface of the semiconductor wafer 30 (the state illustrated in FIG. 2C), chipping caused by the metal film 35 is likely to occur. In the first embodiment, since cutting with a dicing machine is performed after the metal film 35 is etched along the dicing streets 32, it is possible to suppress reduction in yield due to chipping.

Next, various modifications of the first embodiment will be described. In the first embodiment, the copper is used for the metal film 15 (FIG. 1A and FIG. 1B), but other metals may also be used. Note that in order to enhance the heat radiation property, as the metal film 15, it is preferable to use a material having a higher thermal conductivity than that of the semiconductor material used for the semiconductor chip 11. As the metal film 15, in addition to a pure metal composed of a single metal element, a plurality of metal elements or an alloy composed of a metal element and a nonmetal element may be used.

The metal film 15 may have a two-layer structure of a first metal layer for enhancing the heat radiation property and a second metal layer for enhancing a close contact property. The metal film 15 may have a two-layer structure of a first metal layer for enhancing the heat radiation property and a second metal layer for preventing mutual diffusion between the metal and the semiconductor. Alternatively, the metal film 15 may have a multilayer structure with three or more layers. For example, a three-layer structure laminated in order of a palladium layer, a nickel layer, and a copper layer from the side of the semiconductor chip 11 may be used. In this case as well, since an adhesive layer made of an organic material is not interposed between the copper layer for enhancing the heat radiation property and the semiconductor chip 11, a good heat radiation property can be maintained.

Although the GaAs substrate is used as the semiconductor chip 11 in the first embodiment, a substrate made of another semiconductor material, for example, a silicon substrate or the like may also be used.

In the first embodiment, although vapor deposition or sputtering is used for the film formation of the metal film 35 (FIG. 2C), other film formation methods may also be used. For example, after a metal plating with copper or the like is applied to the back surface 30B of the semiconductor wafer 30, the metal plating film may be etched to form the metal film 15 as illustrated in FIG. 2E. In a case of applying the copper plating, it is preferable to form a plating underlayer made of a metal such as titanium (Ti), tungsten (W), palladium (Pd), AuGe, or the like.

Second Embodiment

Next, semiconductor devices according to a second embodiment and modifications thereof will be described with reference to the drawings from FIG. 3A to FIG. 3C. Hereinafter, description of a configuration common to that of the semiconductor device according to the first embodiment will be omitted.

FIG. 3A is a cross-sectional view of the semiconductor device according to the second embodiment. In the first embodiment, although the metal film 15 (FIG. 1B) has a substantially trapezoidal cross-sectional shape, in the second embodiment, the side surface of the metal film 15 forms a reversely tapered shape in the vicinity of the upper end. That is, the metal film 15 includes a projecting portion 15A having an eaves shape projecting toward an outer side portion from the side surface thereof. The projecting portion 15A is arranged on an upper side than the upper surface of the sealing resin layer 20, and is exposed to the outer side portion of the sealing resin layer 20.

The projecting portion 15A can be formed by adjusting etching conditions in the step of etching the metal film 35 formed over the entire region of the semiconductor wafer 30 (FIG. 2C). By adjusting the amount of the resin to be poured into the metal mold for resin molding, the upper surface of the sealing resin layer 20 can be made to be lower than the upper surface of the metal film 15.

FIG. 3B is a cross-sectional view of a semiconductor device according to a first modification of the second embodiment. In the second embodiment, although the side surface of the metal film 15 is formed in the reversely tapered shape in the vicinity of the upper end, in the first modification of the second embodiment, the metal film 15 includes a projecting portion 15B having a flange shape projecting toward the outer side portion from the upper end of the side surface. The projecting portion 15B is arranged at a position higher than the upper surface of the sealing resin layer 20, and is exposed to the outer side portion of the sealing resin layer 20.

Next, a method for manufacturing the semiconductor device according to the first modification of the second embodiment will be described. In the first modification, in the step illustrated in FIG. 2C, the metal film 35 is formed by laminating two types of metals having different etching characteristics. Thereafter, the metal layer on the upper side is etched along the dicing streets 32 (FIG. 2A). Next, under a condition in which an etching rate of the metal layer on the upper side is lower than an etching rate of the metal layer on the lower side, the metal layer on the lower side is isotropically etched. At this time, the etching layer on the lower side is side-etched to form the flange-shaped projecting portion 15B which is formed of the metal layer on the upper side.

FIG. 3C is a cross-sectional view of a semiconductor device according to a second modification of the second embodiment. In the second modification, the metal film 15 has a cross-sectional structure in which the flange-shaped projecting portions 15B are stacked in two stages. Note that it is also possible to stack the flange-shaped projecting portions 15B in three or more stages. The metal film 15 of the semiconductor device according to the second modification can be formed by alternately laminating two types of metals having different etching characteristics and performing etching.

Next, excellent effects of the semiconductor devices according to the second embodiment and the modifications thereof will be described. In the second embodiment and the modifications thereof, the area of the exposed surface of the metal film 15 is larger than that of the first embodiment. Therefore, the heat radiation efficiency can be enhanced. For example, the flange-shaped projecting portion 15B (FIG. 3B and FIG. 3C) functions as a heat radiation fin.

Third Embodiment

Next, a semiconductor device according to a third embodiment will be described with reference to FIG. 4A and FIG. 4B. Hereinafter, description of a configuration common to that of the semiconductor device according to the first embodiment will be omitted.

Figure 4A:
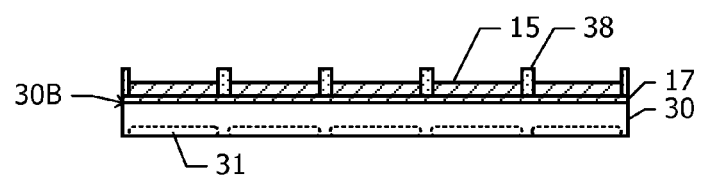
FIG. 4A is a cross-sectional view of a semiconductor wafer in a stage during manufacturing a semiconductor device according to a third embodiment.

FIG. 4A is a cross-sectional view in a stage during manufacturing the semiconductor device according to the third embodiment, and corresponds to the stage during manufacturing illustrated in FIG. 2E of the first embodiment. A plating underlayer 17 is formed on the back surface 30B of the semiconductor wafer 30 by sputtering or the like. For the plating underlayer 17, for example, Ti, W, Pd, AuGe, or the like can be used.

A mask pattern 38 covering a region to be the dicing streets 32 (FIG. 2D) is formed on the plating underlayer 17. For the mask pattern 38, for example, a photoresist, a dry film, or the like can be used. The metal film 15 is formed by plating copper on the plating underlayer 17. After the metal film 15 is formed, the mask pattern 38 is removed. Subsequent steps are common to the manufacturing steps of the semiconductor device according to the first embodiment. The plating underlayer 17 is subjected to dicing processing together with the semiconductor wafer 30.

Figure 4B:
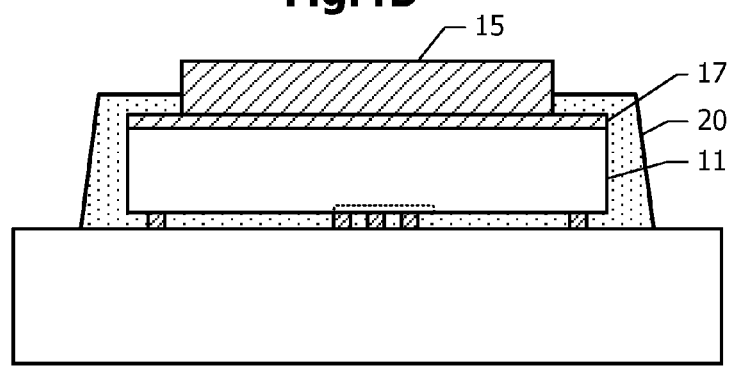
FIG. 4B is a cross-sectional view of the semiconductor device according to the third embodiment.

FIG. 4B is a cross-sectional view of the semiconductor device according to the third embodiment. In the first embodiment, although the metal film 15 is in direct contact with the semiconductor chip 11, in the third embodiment, the plating underlayer 17 is arranged between the semiconductor chip 11 and the metal film 15. The plating underlayer 17 is subjected to the dicing processing together with the semiconductor wafer 30 (FIG. 4A), and therefore covers the entire region of the back surface 30B of the semiconductor chip 11.

In the third embodiment, although the plating underlayer 17 is arranged between the semiconductor chip 11 and the metal film 15, a resin such as an adhesive is not arranged. Therefore, in the same manner as in the first embodiment, it is possible to obtain the effect of preventing the deterioration in thermal conductivity due to a foreign substance such as a resin. Furthermore, in the same manner as in the first embodiment, it is also possible to obtain the effect in which the metal film 15 is less likely to be peeled off from the semiconductor chip 11. Furthermore, since the metal film 15 protrudes upward from the upper surface of the sealing resin layer 20, the high heat radiation property can be ensured.

Furthermore, in the third embodiment as well, the metal film 15 is formed in the state of the semiconductor wafer 30 (FIG. 4A) before cutting with a dicing machine. Therefore, it is possible to reduce the number of manufacturing steps in the same manner as in the first embodiment. Furthermore, since the metal film 15 is not formed on the dicing street 32, it is possible to suppress reduction in yield due to chipping at the time of cutting with the dicing machine.

Next, a semiconductor device according to a modification of the third embodiment will be described with reference to FIG. 5A and FIG. 5B.

Figure 5A:
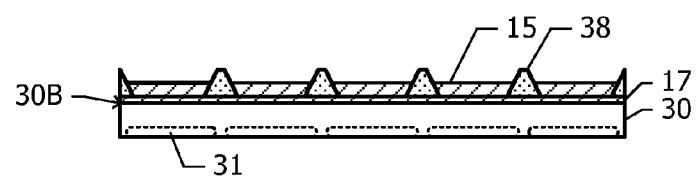
FIG. 5A is a cross-sectional view of a semiconductor wafer in a stage during manufacturing a semiconductor device according to a modification of the third embodiment.

FIG. 5A is a cross-sectional view in a stage during manufacturing the semiconductor device according to the modification of the third embodiment. In the third embodiment, the side surface of the mask pattern 38 (FIG. 4A) stands substantially perpendicularly to the back surface 30B of the semiconductor wafer 30. In the present modification, the side surface of the mask pattern 38 is slanted, and the mask pattern 38 has a trapezoidal cross-sectional shape. Therefore, the side surface of the metal film 15 is slanted so as to face the back surface 30B of the semiconductor wafer 30. In other words, the metal film 15 has an inverted trapezoidal cross-sectional shape.

Figure 5B:
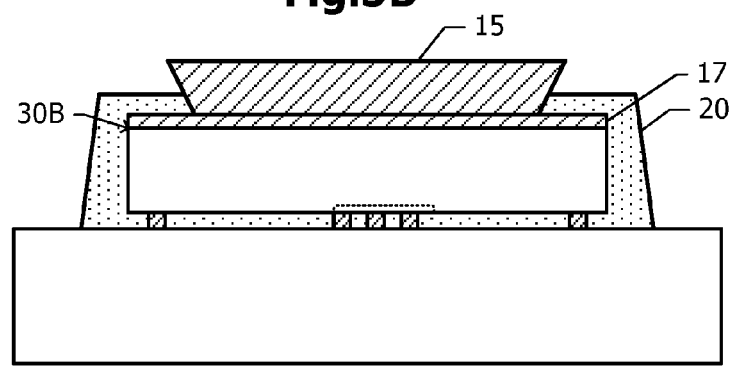
FIG. 5B is a cross-sectional view of the semiconductor device according to the modification of the third embodiment.

FIG. 5B is a cross-sectional view of the semiconductor device according to the present modification. As described with reference to FIG. 5A, the side surface of the metal film 15 is slanted so as to face the back surface 30B of the semiconductor wafer 30 (lower direction). In the present modification, the area of the surface of the metal film 15 exposed from the sealing resin layer 20 is larger than that of the third embodiment illustrated in FIG. 4B. Therefore, the heat radiation property can be further improved.

In the first embodiment, the second embodiment, and the third embodiment, by making the upper surface of the metal film 15 be higher than the upper surface of the sealing resin layer 20, a part of the surface of the metal film 15 is exposed, and the high heat radiation property is ensured. In order to ensure the high heat radiation property, it is sufficient that a part of the surface of the metal film 15 is exposed, and it is not necessary to make the upper surface of the metal film 15 be higher than the upper surface of the sealing resin layer 20. For example, by making the height of the upper surface of the metal film 15 be equal to the height of the upper surface of the sealing resin layer 20, a part of the surface of the metal film 15 may be exposed. Furthermore, the configuration may be such that, by arranging the upper surface of the metal film 15 at a position lower than the upper surface of the sealing resin layer 20 and forming a recess at a part of the upper surface of the sealing resin layer 20, a part of the surface of the metal film 15 is exposed.

Each embodiment described above is merely an example, and it goes without saying that partial replacements or combinations of configurations illustrated among different embodiments are also possible. The same actions and effects in the same configurations in a plurality of embodiments are not stated for each embodiment. Furthermore, the present disclosure is not intended to be limited to the above-described embodiments. For example, it will be obvious to those skilled in the art that various changes, improvements, combinations, or the like can be made.

What is claimed is:

1. A semiconductor device comprising:
   a substrate;
   a semiconductor chip mounted on the substrate in a face-down manner;
   a metal film arranged on a back surface of the semiconductor chip facing an opposite side from the substrate away from an edge of the back surface; and
   a sealing resin layer configured to seal the semiconductor chip with a part of the metal film being exposed from the sealing resin layer, wherein the sidewalls of the part of the metal film have a taper shape.

2. The semiconductor device according to claim 1, wherein
   the metal film protrudes upward from an upper surface of the sealing resin layer.

3. The semiconductor device according to claim 2, wherein
   the metal film is in direct contact with the back surface of the semiconductor chip.

4. The semiconductor device according to claim 3, wherein
   the metal film includes a portion projecting toward an outer side portion from the tapered shaped sidewalls.

5. The semiconductor device according to claim 2, further comprising:
   an underlayer made of a metal that is in direct contact with the back surface of the semiconductor chip,
   wherein the metal film is arranged on the underlayer.

6. The semiconductor device according to claim 5, wherein
   the metal film includes a portion projecting toward an outer side portion from the tapered shaped sidewalls.

7. The semiconductor device according to claim 2, wherein
   the metal film includes a portion projecting toward an outer side portion from the tapered shaped sidewalls.

8. The semiconductor device according to claim 1, wherein
the metal film is in direct contact with the back surface of the semiconductor chip.

9. The semiconductor device according to claim 8, wherein
the metal film includes a portion projecting toward an outer side portion from the tapered shaped sidewalls.

10. The semiconductor device according to claim 1, further comprising:
an underlayer made of a metal that is in direct contact with the back surface of the semiconductor chip,
wherein the metal film is arranged on the underlayer.

11. The semiconductor device according to claim 10, wherein
the metal film includes a portion projecting toward an outer side portion from the tapered shaped sidewalls.

12. The semiconductor device according to claim 1, wherein
the metal film includes a portion projecting toward an outer side portion from the tapered shaped sidewalls.

13. The semiconductor device according to claim 1, wherein
the metal film has a trapezoidal cross-sectional shape.

14. The semiconductor device according to claim 13, wherein the trapezoidal cross-sectional shape is inverted.

15. A semiconductor device comprising:
a substrate;
a semiconductor chip mounted on the substrate in a face-down manner;
a metal film arranged on a back surface of the semiconductor chip facing an opposite side from the substrate away from an edge of the back surface; and
a sealing resin layer configured to seal the semiconductor chip with a part of the metal film being exposed from the sealing resin layer at an opening in the sealing resin layer extending to the semiconductor chip, wherein
the metal film is continuous and fills the entirety of the opening and includes a portion extending from below an upper surface of the sealing resin layer to protrude upward from the upper surface of the sealing resin layer, and
the metal film has a trapezoidal cross-sectional shape.

16. The semiconductor device according to claim 15, wherein the trapezoidal cross-sectional shape is inverted.

17. A semiconductor device comprising:
a substrate;
a semiconductor chip mounted on the substrate in a face-down manner;
a metal film arranged on a back surface of the semiconductor chip facing an opposite side from the substrate away from an edge of the back surface; and
a sealing resin layer configured to seal the semiconductor chip with a part of the metal film being exposed from the sealing resin layer, wherein
the metal film includes a portion projecting toward an outer side portion from a side surface.

* * * * *